(12) United States Patent
Taniguchi

(10) Patent No.: US 11,588,089 B2
(45) Date of Patent: *Feb. 21, 2023

(54) PRINTED WIRING BOARD HAVING THERMOELECTRIC EMLEMENT ACCOMMODATRED THEREIN

(71) Applicant: IBIDEN CO., LTD., Ogaki (JP)

(72) Inventor: Hirotaka Taniguchi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 64 days.

This patent is subject to a terminal disclaimer.

(21) Appl. No.: 16/937,715

(22) Filed: Jul. 24, 2020

(65) Prior Publication Data

US 2021/0028340 A1   Jan. 28, 2021

(30) Foreign Application Priority Data

Jul. 25, 2019   (JP) .............................. JP2019-136989

(51) Int. Cl.
*H01L 35/10*        (2006.01)
*H05K 1/02*         (2006.01)
(Continued)

(52) U.S. Cl.
CPC .............. *H01L 35/10* (2013.01); *H01L 35/32* (2013.01); *H05K 1/0206* (2013.01);
(Continued)

(58) Field of Classification Search
CPC .... H05K 1/186; H05K 1/0206; H05K 1/0209; H05K 1/115; H05K 1/0269; H05K 1/185;
(Continued)

(56) References Cited

U.S. PATENT DOCUMENTS

2007/0119541 A1* 5/2007 Kawabata ............ H05K 3/0058
156/307.7
2011/0123808 A1* 5/2011 Lee ........................ H05K 1/185
428/411.1
(Continued)

FOREIGN PATENT DOCUMENTS

JP     2012-039050 A       2/2012
KR   20140140905 A   * 12/2014
(Continued)

OTHER PUBLICATIONS

WO2017/057259A1 English Translation (Year: 2017).*

*Primary Examiner* — Zachary Pape
*Assistant Examiner* — Amir A Jalali
(74) *Attorney, Agent, or Firm* — Oblon, McClelland, Maier & Neustadt, L.L.P.

(57) ABSTRACT

A printed wiring board includes a core substrate including core material and having opening such that the opening penetrates through the core substrate, thermoelectric elements including P-type and N-type thermoelectric elements such that the thermoelectric elements are accommodated in the opening of the core substrate, a first build-up layer that mounts a heat-absorbing element thereon and includes a first resin insulating layer such that the first resin insulating layer is formed on first surface of the core substrate and covering the opening of the core substrate, and a second build-up layer that mounts a heat-generating element thereon and includes a second resin insulating layer such that the formed on the second resin insulating layer is foamed on second surface of the core substrate on the opposite side and covering the opening of the core substrate and has thickness that is greater than thickness of the first resin insulating layer.

20 Claims, 6 Drawing Sheets

(51) Int. Cl.
*H01L 35/32* (2006.01)
*H05K 7/20* (2006.01)

(52) U.S. Cl.
CPC ........... *H05K 1/0209* (2013.01); *H05K 7/205* (2013.01); *H05K 2201/10219* (2013.01)

(58) Field of Classification Search
CPC ....... H05K 3/4602; H05K 2201/10219; H05K 2201/10015; H05K 2201/10022; H05K 2201/1003; H05K 2201/10522; H05K 2201/0187; H05K 2201/0209; H05K 2203/0191; H01L 35/10; H01L 35/32
See application file for complete search history.

(56) References Cited

U.S. PATENT DOCUMENTS

| | | | | |
|---|---|---|---|---|
| 2011/0284277 | A1* | 11/2011 | Kato | H05K 1/113 |
| | | | | 174/258 |
| 2012/0060887 | A1* | 3/2012 | Kim | H01L 35/34 |
| | | | | 136/224 |
| 2013/0081663 | A1* | 4/2013 | Yang | H01L 35/32 |
| | | | | 136/203 |
| 2014/0118976 | A1* | 5/2014 | Yoshikawa | H01L 23/49827 |
| | | | | 361/763 |
| 2014/0360760 | A1* | 12/2014 | Kiwanami | H05K 3/4697 |
| | | | | 174/251 |
| 2019/0364662 | A1* | 11/2019 | Nishiwaki | H01F 41/046 |
| 2019/0394877 | A1* | 12/2019 | Ishiguro | H05K 3/429 |
| 2020/0119250 | A1* | 4/2020 | Xu | H01L 35/30 |

FOREIGN PATENT DOCUMENTS

| | | | | |
|---|---|---|---|---|
| WO | WO-2004015765 A1 * | 2/2004 | ........... | H05K 3/4608 |
| WO | WO-2014084363 A1 * | 6/2014 | ............. | H01L 35/32 |
| WO | WO-2017057259 A1 * | 4/2017 | ............. | H01L 35/08 |
| WO | WO-2017208950 A1 * | 12/2017 | ............. | H01L 23/36 |
| WO | WO-2019066354 A1 * | 4/2019 | ............. | H01L 35/34 |

* cited by examiner

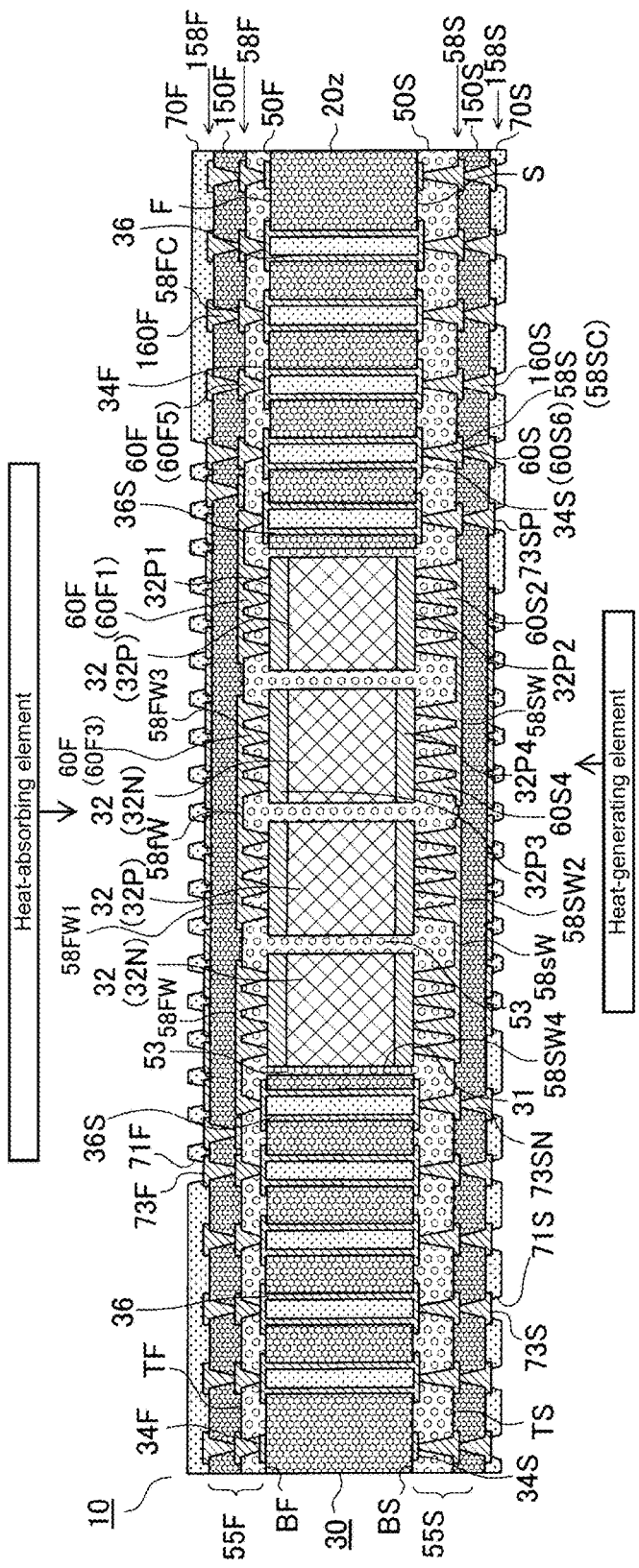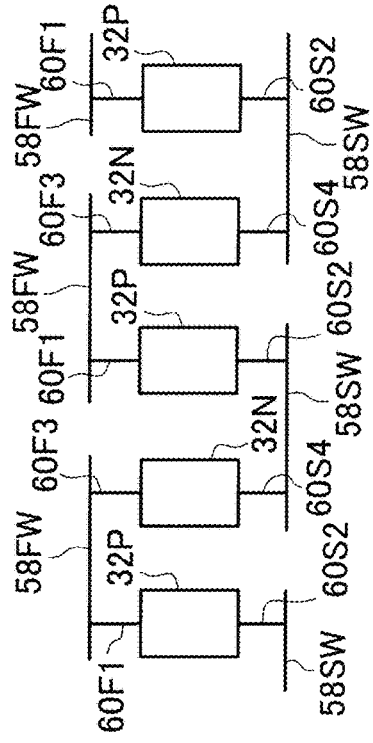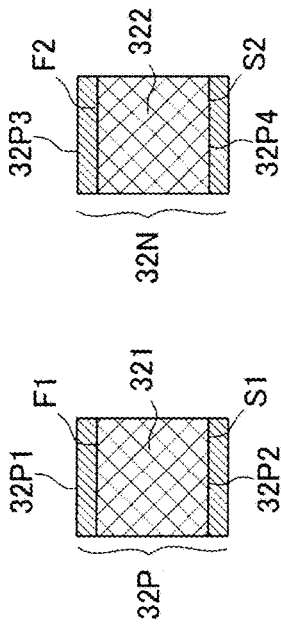

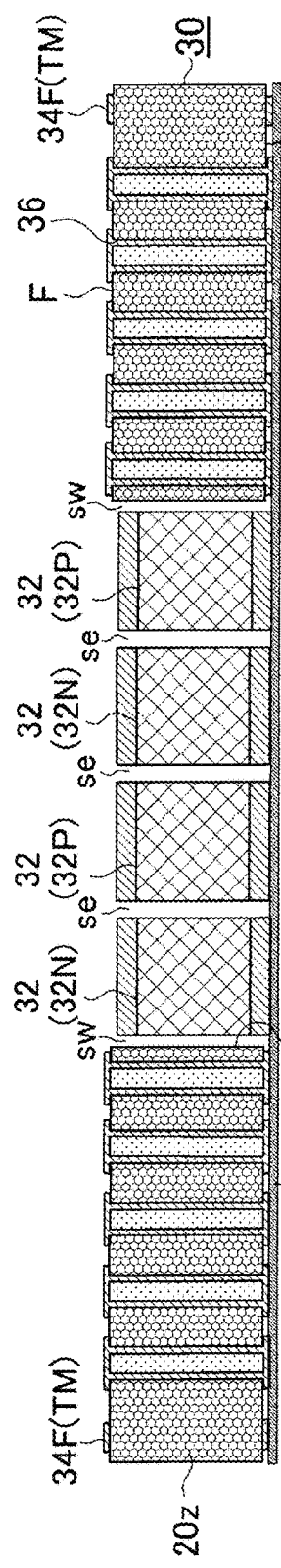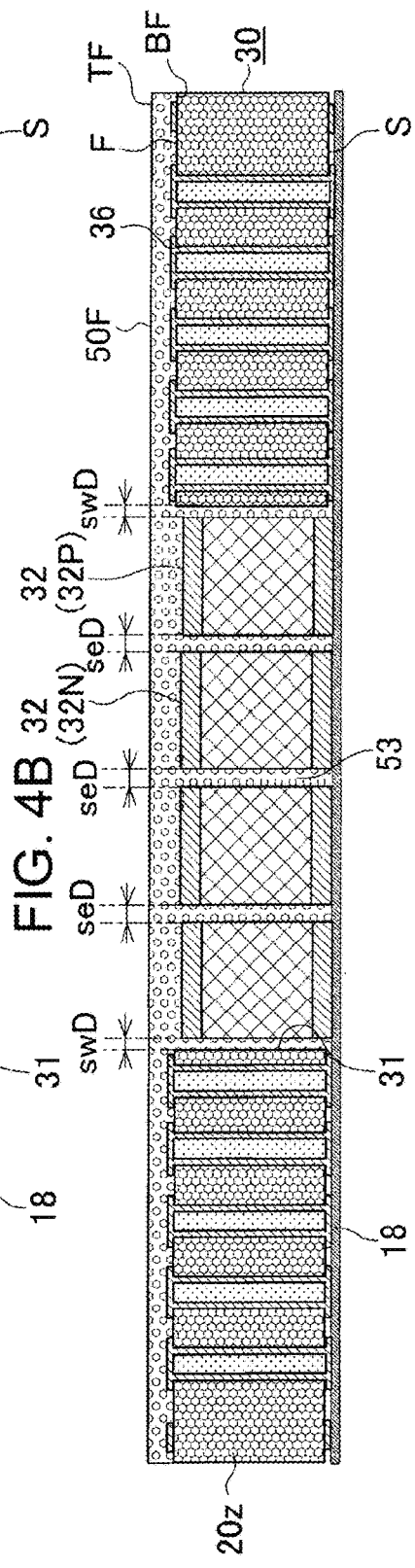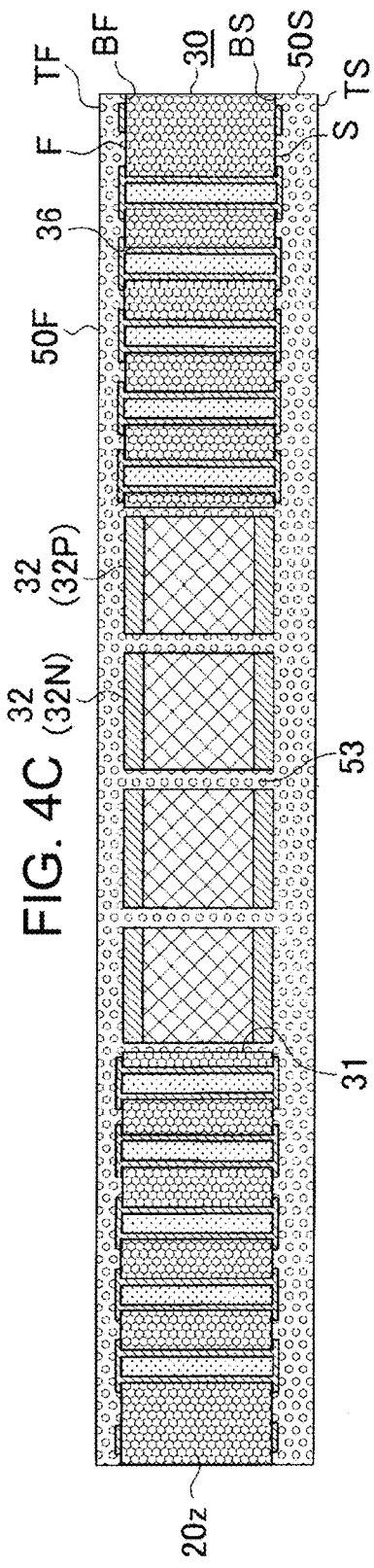

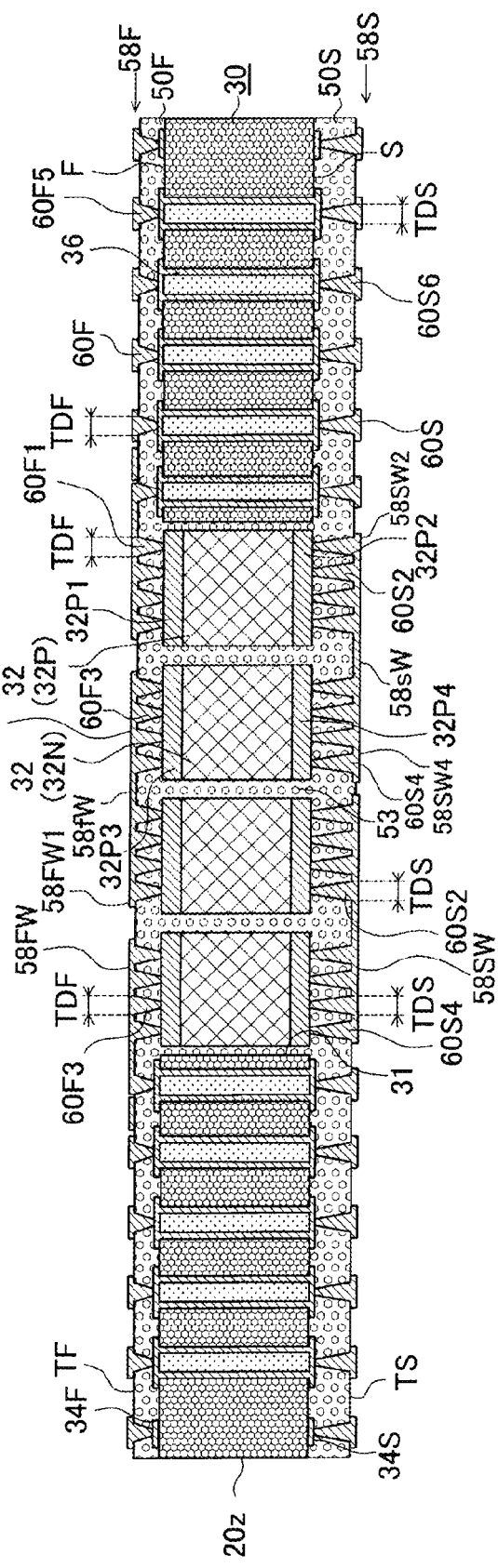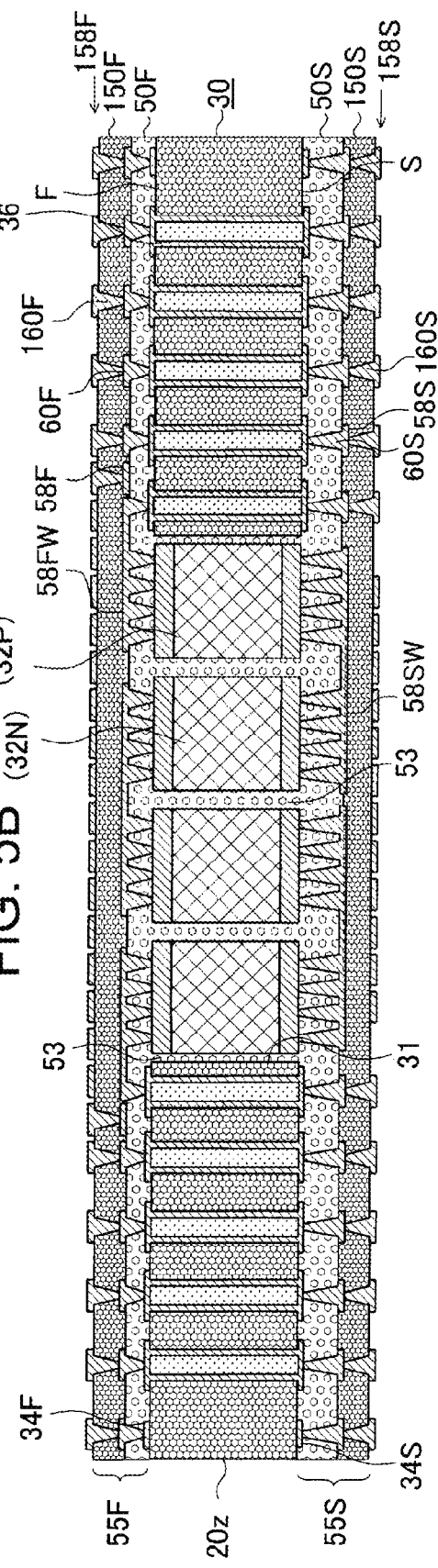

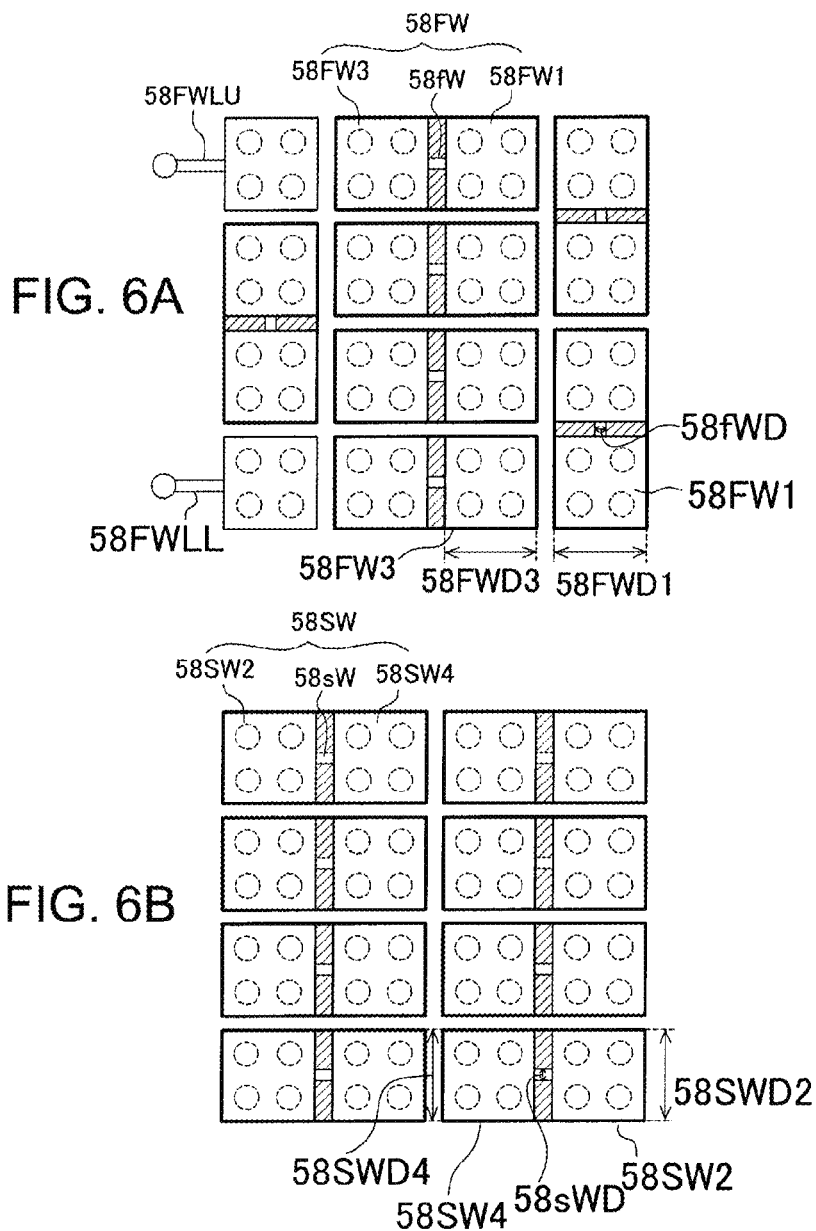

PRINTED WIRING BOARD HAVING THERMOELECTRIC EMLEMENT ACCOMMODATRED THEREIN

CROSS-REFERENCE TO RELATED APPLICATIONS

The present application is based upon and claims the benefit of priority to Japanese Patent Application No. 2019-136989, filed Jul. 25, 2019, the entire contents of which are incorporated herein by reference.

BACKGROUND OF THE INVENTION

Field of the Invention

The present invention relates to a printed wiring board in which P-type thermoelectric elements and N-type thermoelectric elements are accommodated in an opening.

Description of Background Art

Japanese Patent Application Laid-Open Publication No. 2012-39050 describes a metal substrate in which Peltier elements are embedded. The entire contents of this publication are incorporated herein by reference.

SUMMARY OF THE INVENTION

According to one aspect of the present invention, a printed wiring board includes a core substrate including a core material and having an opening such that the opening penetrates through the core substrate, thermoelectric elements including P-type thermoelectric elements and N-type thermoelectric elements such that the thermoelectric elements are accommodated in the opening of the core substrate, a first build-up layer that mounts a heat-absorbing element thereon and includes a first resin insulating layer such that the first resin insulating layer is formed on a first surface of the core substrate and covering the opening of the core substrate, and a second build-up layer that mounts a heat-generating element thereon and includes a second resin insulating layer such that the formed on the second resin insulating layer is formed on a second surface of the core substrate on the opposite side with respect to the first surface of the core substrate and covering the opening of the core substrate and has a thickness that is greater than a thickness of the first resin insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A is a cross-sectional view of a printed wiring board according to a first embodiment of the present invention;

FIGS. 1B and 1C are each a cross-sectional view of an electronic component;

FIG. 1D is schematic diagram illustrating some of for-built-in-component wirings;

FIGS. 4A-4C are manufacturing process diagrams of the printed wiring board of the first embodiment;

FIGS. 5A and 5B are manufacturing process diagrams of the printed wiring board of the first embodiment;

FIGS. 6A and 6B are plan views illustrating wirings connecting the electronic components; and FIGS. 6C and 6D are cross-sectional views of via conductors.

DETAILED DESCRIPTION OF THE EMBODIMENTS

Figure 2A:
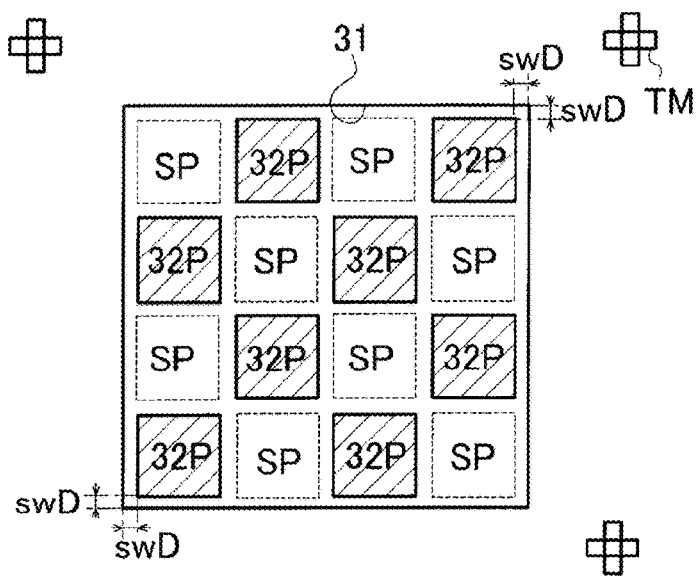
FIGS. 2A and 2B illustrate a method of the first embodiment for accommodating electronic components.

Embodiments will now be described with reference to the accompanying drawings, wherein like reference numerals designate corresponding or identical elements throughout the various drawings.

First Embodiment

FIG. 1A is a cross-sectional view of a printed wiring board 10 of a first embodiment. The printed wiring board 10 has a core substrate 30 having a fifth surface (F) and a sixth surface (S) on an opposite side with respect to the fifth surface (F), a first build-up layer (55F) formed on the fifth surface (F) of the core substrate 30, and a second build-up layer (55S) formed on the sixth surface (S) of the core substrate 30.

The core substrate 30 has a core material (insulating substrate) (20z) having a fifth surface (F) and a sixth surface (S) on an opposite side with respect to the fifth surface (F), a fifth conductor layer (34F) formed on the fifth surface of the core material (20z), a sixth conductor layer (34S) formed on the sixth surface (S) of the core material (20z), and through-hole conductors 36 connecting the fifth conductor layer (34F) and the sixth conductor layer (34S) to each other. The core substrate 30 further has an opening 31 that extends from the fifth surface (F) to the sixth surface (S). Multiple P-type thermoelectric elements (32P) and multiple N-type thermoelectric elements (32N) are accommodated in the opening 31. Spaces between the P-type thermoelectric elements (32P) and the N-type thermoelectric elements (32N) are filled with a resin 53. Spaces between the P-type thermoelectric elements (32P) and the core substrate 30 are filled with the resin 53. Spaces between the N-type thermoelectric elements (32N) and the core substrate 30 are filled with the resin 53. The P-type thermoelectric elements (32P) and the N-type thermoelectric elements (32N) are fixed to the core substrate 30 by the resin 53.

FIG. 1B illustrates one of the P-type thermoelectric elements (32P).

Each of the P-type thermoelectric elements (32P) respectively has electrodes (32P1, 32P2) at two ends thereof. The P-type thermoelectric elements (32P) are each formed of a P-type semiconductor element 321 having a first surface (F1) and a second surface (S1) on an opposite side with respect to the first surface (F1), the first electrode (32P1) on the first surface (F1), and the second electrode (32P2) on the second surface (S1). The P-type semiconductor element 321 is sandwiched between the first electrode (32P1) and the second electrode (32P2).

The first electrode (32P1) faces the fifth surface (F) of the core substrate 30, and the second electrode (32P2) faces the sixth surface (5) of the core substrate 30. The P-type semiconductor element is preferably a P-type thermoelectric element.

The P-type thermoelectric elements (32P) are embedded in the opening 31 such that the first electrodes (32P1) face the fifth surface (F).

FIG. 1C illustrates one of the N-type thermoelectric elements (32N).

Each of the N-type thermoelectric elements (32N) has electrodes (32P3, 32P4) at two ends thereof. For example, the N-type thermoelectric elements (32N) are each formed of an N-type semiconductor element 322 having a third surface (F2) and a fourth surface (S2) on an opposite side with respect to the third surface (F2), the third electrode (32P3) on the third surface (F2), and the fourth electrode (32P4) on the fourth surface (S2). The N-type semiconductor element 322 is sandwiched between the third electrode (32P3) and the fourth electrode (32P4).

The third electrode (32P3) faces the fifth surface (F) of the core substrate 30, and the fourth electrode (32P4) faces the sixth surface (S) of the core substrate 30. The N-type semiconductor element is preferably an N-type thermoelectric element. The N-type thermoelectric elements (32N) are embedded in the opening 31 such that the third electrodes (32P3) face the fifth surface (F).

The first build-up layer (55F) includes a first resin insulating layer (50F) formed on the fifth surface (F) of the core substrate 30 and on the fifth conductor layer (34F), a first conductor layer (58F) formed on the first resin insulating layer (50F), a third resin insulating layer (outermost first resin insulating layer) (150F) formed on the first conductor layer (58F) and on the first resin insulating layer (50F), and a third conductor layer (158F) formed on the third resin insulating layer (150F). The first resin insulating layer (50F) covers the opening 31. The resin 53 and the first resin insulating layer (50F) are integrally formed. Spaces between the P-type thermoelectric elements (32P) and a side wall of the core substrate 30 exposed from the opening 31 are filled with a resin originating from the first resin insulating layer (50F). Spaces between the N-type thermoelectric elements (32N) and the side wall of the core substrate 30 exposed from the opening 31 are filled with the resin originating from the first resin insulating layer (50F). Spaces between the P-type thermoelectric elements (32P) and the N-type thermoelectric elements (32N) are filled with the resin originating from the first resin insulating layer (50F). A component originating from the first resin insulating layer (50F) forms the resin 53. The resin 53 can contain a resin and inorganic particles originating from the first resin insulating layer (50F).

The first conductor layer (58F) has a first conductor circuit (58FW) formed directly on the opening 31, and an on-core-material first conductor circuit (58FC) formed directly on the core material (20z). Adjacent P-type thermoelectric elements (32P) and N-type thermoelectric elements (32N) are connected to each other by the first conductor circuit (58FW).

FIG. 6A is a plan view illustrating the first conductor circuit (58FW). The first conductor circuit (58FW) includes on-first-electrode first conductor circuits (58FW1) respectively covering the first electrodes (32P1), on-third-electrode first conductor circuits (58FW3) respectively covering the third electrodes (32P3), and first wirings (58FW) connecting the on-first-electrode first conductor circuits (58FW1) to the on-third-electrode first conductor circuits (58FW3). The on-first-electrode first conductor circuits (58FW1) are respectively positioned on the first electrodes (32P1), and a size of each of the on-first-electrode first conductor circuits (58FW1) is larger than a size of each of the first electrodes (32P1). The on-third-electrode first conductor circuits (58FW3) are respectively positioned on the third electrodes (32P3), and a size of each of the on-third-electrode first conductor circuits (58FW3) is larger than a size of each of the third electrodes (32P3). A width (58/WD) of each of the first wirings (58/W) is equal to a width (58FWD1) of each of the on-first-electrode first conductor circuits (58FW1). Or, the width (58/WD) of each of the first wirings (58/W) is smaller than the width (58FWD1) of each of the on-first-electrode first conductor circuits (58FW1). The width (58/WD) of each of the first wirings (58/W) is equal to a width (58FWD3) of each of the on-third-electrode first conductor circuits (58FW3). Or, the width (58/WD) of each of the first wirings (58/W) is smaller than the width (58FWD3) of each of the on-third-electrode first conductor circuits (58FW3).

Dotted lines in the on-first-electrode first conductor circuits (58FW1) respectively indicate outer peripheries of top parts of for-first-electrode first via conductors (60F1). The on-first-electrode first conductor circuits (58FW1) are connected to the first electrodes (32P1) by the multiple for-first-electrode first via conductors (60F1).

Dotted lines in the on-third-electrode first conductor circuits (58FW3) respectively indicate outer peripheries of top parts of for-third-electrode first via conductors (60F3). The on-third-electrode first conductor circuits (58FW3) are connected to the third electrodes (32P3) by the multiple for-third-electrode first via conductors (60F3).

One on-first-electrode first conductor circuit (58FW1) is formed on one first electrode (32P1). One on-third-electrode first conductor circuit (58FW3) is formed on one third electrode (32P3).

The first build-up layer (55F) further has first via conductors (60F) penetrating the first resin insulating layer (50F) and third via conductors (160F) penetrating the third resin insulating layer (150F). The first via conductors (60F) include via conductors (for-fifth-conductor-layer first via conductors) (60F5) that connect the fifth conductor layer (34F) to the on-core-material first conductor circuit (58FC), the via conductors (the for-first-electrode first via conductors) (60F1) that connect the first electrodes (32P1) to the on-first-electrode first conductor circuits (58FW1), and the via conductors (the for-third-electrode first via conductors) (60F3) that connect the third electrodes (32P3) to the on-third-electrode first conductor circuits (58FW3). The number of the for-first-electrode first via conductors (60F1) that connect one of the first electrodes (32P1) to one of the on-first-electrode first conductor circuits (58FW1) is 2 or more. For example, the number of the for-first-electrode first via conductors (60F1) reaching one of the first electrodes (32P1) is 20 or more. A heat dissipation effect can be increased. Connection reliability can be increased even when the P-type thermoelectric elements (32P) and N-type thermoelectric elements (32N) expand or contract. The number of the for-third-electrode first via conductors (60F3) that connect one of the third electrodes (32P3) to one of the on-third-electrode first conductor circuits (58FW3) is 2 or more. For example, the number of the for-third-electrode first via conductors (60F3) reaching one of the third electrodes (32P3) is 20 or more. A heat dissipation effect can be increased. Connection reliability can be increased even when the electronic components 32 expand or contract.

The first resin insulating layer (50F) has a bottom surface (BF) opposing the fifth surface (F) and a top surface (TF) on an opposite side with respect to the bottom surface (BF). As illustrated in FIG. 6C, a thickness (Tf) of the first resin insulating layer (50F) is an insulation distance from the first conductor layer (58F) to the fifth conductor layer (34F), the first electrodes (32P1), and the third electrodes (32P3). Then, the for-fifth-conductor-layer first via conductors (60F5), the for-first-electrode first via conductors (60F1) and the for-third-electrode first via conductors (60F3) each have a top diameter (TDF) at a position of the top surface (TF). The top diameter (TDF) of each of the for-fifth-conductor-layer first via conductors (60F5), the top diameter (TDF) of each of the for-first-electrode first via conductors (60F1), and the top diameter (TDF) of each of the for-third-electrode first via conductors (60F3) are substantially equal to each other. The top diameter (TDF) is illustrated in FIG. 6C. The for-fifth-conductor-layer first via conductors (60F5), the for-first-electrode first via conductors (60F1) and the for-third-electrode first via conductors (60F3) each have a bottom diameter (BDF) at a bottom position (upper surfaces of the fifth conductor layer (34F), the first electrodes (32P1), and the third electrodes (32P3)). The bottom diameter (BDF) of each of the for-fifth-conductor-layer first via conductors (60F5), the bottom diameter (BDF) of each of the for-first-electrode first via conductors (60F1), and the bottom diameter (BDF) of each of the for-third-electrode first via conductors (60F3) are substantially equal to each other. A length of each of the for-fifth-conductor-layer first via conductors (60F5), the for-first-electrode first via conductors (60F1) and the for-third-electrode first via conductors (60F3) is substantially equal to the thickness (Tf) of the first resin insulating layer (50F). A shallow recess (58FR) (having a short distance from a flat upper surface to a bottom) is formed in the first conductor layer (58F) above each of the for-fifth-conductor-layer first via conductors (60F5), the for-first-electrode first via conductors (60F1) and the for-third-electrode first via conductors (60F3).

The second build-up layer (55S) includes a second resin insulating layer (50S) formed on the sixth surface (S) of the core substrate 30 and on the sixth conductor layer (34S), a second conductor layer (58S) formed on the second resin insulating layer (50S), a fourth resin insulating layer (outermost second resin insulating layer) (150S) formed on the second conductor layer (58S) and on the second resin insulating layer (50S), and a fourth conductor layer (158S) formed on the fourth resin insulating layer (150S).

The second conductor layer (58S) has a second conductor circuit (58SW) formed directly on the opening 31, and an on-core-material second conductor circuit (58SC) formed directly on the core material (20z).

Adjacent P-type thermoelectric elements (32P) and N-type thermoelectric elements (32N) are connected to each other by the second conductor circuit (58SW).

FIG. 6B is a plan view illustrating the second conductor circuit (58SW). The second conductor circuit (58SW) includes on-second-electrode second conductor circuits (58SW2) respectively covering the second electrodes (32P2), on-fourth-electrode second conductor circuits (58SW4) respectively covering the fourth electrodes (32P4), and second wirings (58sW) each connecting an on-second-electrode second conductor circuit (58SW2) to an on-fourth-electrode second conductor circuit (58SW4). The on-second-electrode second conductor circuits (58SW2) are respectively formed on the second electrode (32P2), and a size of each of the on-second-electrode second conductor circuits (58SW2) is larger than a size of each of the second electrodes (32P2). The on-fourth-electrode second conductor circuits (58SW4) are respectively formed on the fourth electrode (32P4), and a size of each of the on-fourth-electrode second conductor circuits (58SW4) is larger than a size of each of the fourth electrodes (32P4). A width (58sWD) of each of the second wirings (58sW) is equal to a width (58SWD2) of each of the on-second-electrode second conductor circuits (58SW2). Or, the width (58sWD) of each of the second wirings (58sW) is smaller than the width (58SWD2) of each of the on-second-electrode second conductor circuits (58SW2). The width (58sWD) of each of the second wirings (58sW) is equal to a width (58SWD4) of each of the on-fourth-electrode second conductor circuits (58SW4). Or, the width (58sWD) of each of the second wirings (58sW) is smaller than the width (58SWD4) of each of the on-fourth-electrode second conductor circuits (58SW4).

Dotted lines in the on-second-electrode second conductor circuits (58SW2) respectively indicate outer peripheries of top parts of for-second-electrode second via conductors (60S2). The on-second-electrode second conductor circuits (58SW2) are connected to the second electrodes (32P2) by the multiple for-second-electrode second via conductors (60S2).

Dotted lines in the on-fourth-electrode second conductor circuit (58SW4) respectively indicate outer peripheries of top parts of for-fourth-electrode second via conductors (60S4). The on-fourth-electrode second conductor circuits (58SW4) are connected to the fourth electrodes (32P4) by the multiple for-fourth-electrode second via conductors (60S4).

One on-second-electrode second conductor circuit (58SW2) is formed on one second electrode (32P2). One on-fourth-electrode second conductor circuit (58SW4) is formed on one fourth electrode (32P4).

The second build-up layer (55S) further has second via conductors (60S) penetrating the second resin insulating layer (50S) and fourth via conductors (160S) penetrating the fourth resin insulating layer (150S). The second via conductors (60S) include via conductors (for-sixth-conductor-layer second via conductors) (60S6) that connect the sixth conductor layer (34S) to the on-core-material second conductor circuit (58SC), the via conductors (the for-second-electrode second via conductors) (60S2) that connect the second electrodes (32P2) to the on-second-electrode second conductor circuits (58SW2), and the via conductors (the for-fourth-electrode second via conductors) (60S4) that connect the fourth electrodes (32P4) to the on-fourth-electrode second conductor circuits (58SW4). The number of the for-second-electrode second via conductors (60S2) that connect one second electrode (32P2) to one on-second-electrode second conductor circuit (58SW2) is 2 or more. For example, the number of the for-second-electrode second via conductors (60S2) reaching one second electrode (32P2) is 20 or more. A heat dissipation effect can be increased. Connection reliability can be increased even when the electronic components 32 expand or contract. The number of the for-fourth-electrode second via conductors (60S4) that connect one fourth electrode (32P4) to one on-fourth-electrode second conductor circuit (58SW4) is 2 or more. For example, the number of the for-fourth-electrode second via conductors (60S4) reaching one fourth electrode (32P4) is 20 or more. A heat dissipation effect can be increased. Connection reliability can be increased even when the electronic components 32 expand or contract.

The second resin insulating layer (50S) has a bottom surface (BS) opposing the sixth surface (S) and a top surface (TS) on an opposite side with respect to the bottom surface (BS). As illustrated in FIG. 6D, a thickness (Ts) of the second resin insulating layer (50S) is an insulation distance from the second conductor layer (58S) to the sixth conductor layer (34S), the second electrodes (32P2), and the fourth electrodes (32P4). Then, the for-sixth-conductor-layer second via conductors (60S6), the for-second-electrode second via conductors (60S2) and the for-fourth-electrode second via conductors (60S4) each have a top diameter (TDS) at a position of the top surface (TS). The top diameter (TDS) of each of the for-sixth-conductor-layer second via conductors (60S6), the top diameter (TDS) of each of the for-second-electrode second via conductors (60S2) and the top diameter (TDS) of each of the for-fourth-electrode second via conductors (60S4) are substantially equal to each other. The top diameter (TDS) is illustrated in FIG. 6D. The for-sixth-conductor-layer second via conductors (60S6), the for-second-electrode second via conductors (60S2) and the for-fourth-electrode second via conductors (60S4) each have a bottom diameter (BDS) at a bottom position (the sixth conductor layer (34S), the second electrodes (32P2), and the fourth electrodes (32P4)). The bottom diameter (BDS) of each of the for-sixth-conductor-layer second via conductors (60S6), the bottom diameter (BDS) of each of the for-second-electrode second via conductors (60S2), and the bottom diameter (BDS) of each of the for-fourth-electrode second via conductors (60S4) are substantially equal to each other. A length of each of the for-sixth-conductor-layer second via conductors (60S6), the for-second-electrode second via conductors (60S2), and the for-fourth-electrode second via conductors (60S4) is substantially equal to the thickness (Ts) of the second resin insulating layer (50S). A recess (58SR) deeper (having a longer distance from a flat upper surface to a bottom) than the recess (58FR) on the first conductor layer (58F) illustrated in FIG. 6C is formed in the second conductor layer (58S) above each of the for-sixth-conductor-layer second via conductors (60S6), the for-second-electrode second via conductors (60S2) and the for-fourth-electrode second via conductors (60S4).

The thickness (Tf) of the first resin insulating layer (50F) illustrated in FIG. 6C is smaller than the thickness (Ts) of the second resin insulating layer (50S) illustrated in FIG. 6D. The length (Tf) of each of the for-fifth-conductor-layer first via conductors (60F5), the for-first-electrode first via conductors (60F1) and the for-third-electrode first via conductors (60F3) is shorter than the length (Ts) of each of the for-sixth-conductor-layer second via conductors (60S6), the for-second-electrode second via conductors (60S2) and the for-fourth-electrode second via conductors (60S4). The top diameter (TDF) of each of the for-fifth-conductor-layer first via conductors (60F5), the for-first-electrode first via conductors (60F1) and the for-third-electrode first via conductors (60F3) is substantially equal to the top diameter (TDS) of each of the for-sixth-conductor-layer second via conductors (60S6), the for-second-electrode second via conductors (60S2) and the for-fourth-electrode second via conductors (60S4). The bottom diameter (BDF) of each of the for-fifth-conductor-layer first via conductors (60F5), the for-first-electrode first via conductors (60F1) and the for-third-electrode first via conductors (60F3) is larger than the bottom diameter (BDS) of each of the for-sixth-conductor-layer second via conductors (60S6), the for-second-electrode second via conductors (60S2) and the for-fourth-electrode second via conductors (60S4). Therefore, each of the for-fifth-conductor-layer first via conductors (60F5), the for-first-electrode first via conductors (60F1) and the for-third-electrode first via conductors (60F3) has a larger bonding area and thus a larger bonding force at the bottom than that of each of the for-sixth-conductor-layer second via conductors (60S6), the for-second-electrode second via conductors (60S2) and the for-fourth-electrode second via conductors (60S4).

By making the thickness (Tf) of the first resin insulating layer (50F) on the first build-up layer (55F) side, where an integrated circuit (heat-absorbing element) such as an ASIC having a size larger than that of a light emitting element (heat-dissipating element) such as an LED or a semiconductor laser is mounted and where a larger stress is applied, smaller than the thickness (Ts) of the second resin insulating layer (50S), the length (Tf) of each of the for-fifth-conductor-layer first via conductors (60F5), the for-first-electrode first via conductors (60F1), and the for-third-electrode first via conductors (60F3) provided in the first resin insulating layer (50F) is shortened, resistance against a large stress is increased, and reliability of the via conductors is increased. Further, by forming the deep recess (58FR) (having a long distance from a flat upper surface to a bottom) in the second conductor layer (58S) above each of the for-sixth-conductor-layer second via conductors (60S6), the for-second-electrode second via conductors (60S2) and the for-fourth-electrode second via conductors (60S4), a contact area between the second conductor layer (58S) and the second resin insulating layer (50S) is increased, and heat transfer performance is improved.

A second solder resist layer (70S) having openings (71S) can be formed on the fourth conductor layer (158S) and the fourth resin insulating layer (150S). The fourth conductor layer (158S) exposed from the openings (71S) forms second pads (73S). An example of an electronic component to be mounted on the second pads (73S) is a light-emitting element such as an LED or a semiconductor laser, and is a heat-generating element that has a small size and generates a large amount of heat when in operation.

A first solder resist layer (70F) having openings (71F) can be formed on the third resin insulating layer (150F) and the third conductor layer (158F). The third conductor layer (158F) exposed from the openings (71F) forms first pads (73F) for mounting an electronic component. An example of an electronic component to be mounted on the first pads (73F) is an integrated circuit having a large size such as an ASIC, which has a large heat capacity and forms a heat-absorbing element that absorbs heat from a heat-generating element mounted on the second pads (73S).

The first resin insulating layer (50F) and the second resin insulating layer (50S) are each formed of a low thermal conductivity material (0.35 W/ink) that does not have a core material. For example, an ABF (Ajinomoto Build-up Film: manufactured by Ajinomoto Fine Techno Co., Ltd.) can be used. The first resin insulating layer (50F) and the second resin insulating layer (50S) are each formed of a resin that does not contain inorganic fibers but contains ultra-small inorganic filler particles. Specifically, the first resin insulating layer (50F) and the second resin insulating layer (50S) each include an epoxy-based resin, a polymer-based resin, and a curing agent. The inorganic filler particles have a size (average filler particle size) of 0.05-10 µm, and a maximum size of 10 µm. An amount of the inorganic filler is 35-75 w %. The resin 53 originating from the first resin insulating layer (50F) filled in the opening 31 has the same physical properties as the first resin insulating layer (50F). The thermal conductivity of the core material (20z) is about the same as that of the first resin insulating layer (50F) and the second resin insulating layer (50S).

The third resin insulating layer (outermost first resin insulating layer) (150F) on the first resin insulating layer (50F) and the fourth resin insulating layer (outermost second resin insulating layer) (150S) on the second resin insulating layer (50S) are each formed of a high thermal conductivity material (0.5 W/mk) that has a core material. For example, a copper-clad laminated plate obtained by laminating a copper foil on a GHPL830NS prepreg (manufactured by Mitsubishi Gas Chemical Inc) can be used.

The first resin insulating layer (50F), the second resin insulating layer (50S), and the resin 53, which have a low thermal conductivity, are formed around the P-type thermoelectric elements (32P) and the N-type thermoelectric elements (32N), and a heat-insulation structure is formed. Therefore, heat can be efficiently dissipated via the for-first-electrode first via conductors (60F1), the for-third-electrode first via conductors (60F3), the for-second-electrode second via conductors (60S2), and the for-fourth-electrode second via conductors (60S4). Since the third resin insulating layer (outermost first resin insulating layer) (150F) and the fourth resin insulating layer (outermost second resin insulating layer) (150S) have a high thermal conductivity, heat from a heat-generating element such as an LED surface-mounted on the fourth resin insulating layer (outermost second resin insulating layer) (150S) can be efficiently transmitted to a heat-absorbing element having a large size such as an ASIC surface-mounted on the third resin insulating layer (outermost first resin insulating layer) (150F). The third resin insulating layer (outermost first resin insulating layer) (150F) and the fourth resin insulating layer (outermost second resin insulating layer) (150S) desirably have a thermal conductivity of 1.2 or more times that of the first resin insulating layer (50F) and the second resin insulating layer (50S).

In particular, in the printed wiring board of the first embodiment, via conductors penetrating the third resin insulating layer (outermost first resin insulating layer) (150F) are not provided on the for-first-electrode first via conductors (60F1) connecting the on-first-electrode first conductor circuits (58FW1) to the first electrodes (32P1) and on the for-third-electrode first via conductors (60F3) connecting the on-third-electrode first conductor circuits (58FW3) to the third electrodes (32P3). Further, via conductors penetrating the fourth resin insulating layer (outermost second resin insulating layer) (150S) are not provided on the for-second-electrode second via conductors (60S2) connecting the on-second-electrode second conductor circuit (58SW2) to the second electrodes (32P2) and on the for-fourth-electrode second via conductors (6054) connecting the on-fourth-electrode second conductor circuit (585W4) to the fourth electrodes (32P4). Since the via conductors are not provided, insulation reliability is high. Heat from the P-type thermoelectric elements (32P) and the N-type thermoelectric elements (32N) is transmitted via the for-first-electrode first via conductors (60F1), the for-third-electrode first via conductors (60F3), the for-second-electrode second via conductors (60S2), and the for-fourth-electrode second via conductors (60S4), and is not transmitted via the first resin insulating layer (50F) and the second resin insulating layer (50S) which have a low thermal conductivity and form a heat-insulation structure, and heat from the above-described heat-generating element can be efficiently released to the heat-absorbing element via the third resin insulating layer (outermost first resin insulating layer) (150F) and the fourth resin insulating layer (outermost second resin insulating layer) (150S) which have a high thermal conductivity.

Further, in the printed wiring board of the first embodiment, since the third resin insulating layer (outermost first resin insulating layer) (150F) and the fourth resin insulating layer (outermost second resin insulating layer) (150S) each have a core material and are high in rigidity, even when the first resin insulating layer (50F) and the second resin insulating layer (50S) which do not each have a core material and are low in rigidity are formed on an inner-layer side, reliability is unlikely to decrease.

A method for connection between the P-type thermoelectric elements (32P), the N-type thermoelectric elements (32N), the first conductor circuit (58FW), the for-first-electrode first via conductors (60F1), the for-third-electrode first via conductors (60F3), the second conductor circuit (58SW), the for-second-electrode second via conductors (60S2) and the for-fourth-electrode second via conductors (60S4) is schematically illustrated in FIGS. 1D, 6A, and 6B. FIG. 1D is a cross-sectional view. As illustrated in these drawings, the P-type thermoelectric elements (32P) and the N-type thermoelectric elements (32N) are connected in series via the first conductor circuit (58FW), the for-first-electrode first via conductors (60F1), the for-third-electrode first via conductors (60F3), the second conductor circuit (58SW), the for-second-electrode second via conductors (60S2) and the for-fourth-electrode second via conductors (60S4). The P-type thermoelectric elements (32P) and the N-type thermoelectric elements (32N) are alternately connected. The P-type thermoelectric elements (32P) and the N-type thermoelectric elements (32N) are alternately positioned and connected in series. Connections between the P-type thermoelectric elements (32P) and the N-type thermoelectric elements (32N) via the first conductor circuit (58FW) and connections between the P-type thermoelectric elements (32P) and the N-type thermoelectric elements (32N) via the second conductor circuit (58SW) are alternately repeated.

As illustrated in FIG. 1A, the second pads (73S) include second pads (plus pads) (73SP) having a plus electric potential and second pads (minus pads) (73SN) having a minus electric potential. And, the multiple P-type thermoelectric elements (32P) and the multiple N-type thermoelectric elements (32N) are positioned between the plus pads (73SP) and the minus pads (73SN). Wirings (for-built-in-component wirings) from the plus pads (73SP) to the minus pads (73SN) via the P-type thermoelectric elements (32P) and the N-type thermoelectric elements (32N) are independent of each other in the printed wiring board 10. The for-built-in-component wirings include the first conductor circuit (58FW), the for-first-electrode first via conductors (60F1), the for-third-electrode first via conductors (60F3), the second conductor circuit (58SW), the for-second-electrode second via conductors (60S2), and the for-fourth-electrode second via conductors (60S4). The for-built-in-component wirings are not connected to conductor circuits in the printed wiring board other than the for-built-in-component wirings. Data transmitted in the printed wiring board 10 is unlikely to deteriorate. Through-hole conductors (36S) surrounding the opening 31 are included in the for-built-in-component wirings. For example, the number of the through-hole conductors (36S) included in the for-built-in-component wirings is 2. A first conductor circuit (58FWLU) at upper left of FIG. 6A extends from a position above the opening 31 to a position above the core material (20z) and connects to a through-hole conductor (36S). A first conductor circuit (58FWLL) at lower left of FIG. 6A extends from a position above the opening 31 to a position above the core material (20z) and connects to a through-hole conductor (36S).

Second pads having an electric potential lower than that of the plus pads are included in the minus pads.

The P-type thermoelectric elements (32P) and the N-type thermoelectric elements (32N) are connected to the second conductor circuit (58SW) via the second via conductors (60S). Therefore, even when the P-type thermoelectric elements (32P) and the N-type thermoelectric elements (32N) are embedded in the core substrate, heat can be transmitted to the P-type thermoelectric elements (32P) and the N-type thermoelectric elements (32N) via the second conductor circuit (58SW). Heat can be efficiently transmitted to the P-type thermoelectric elements (32P) and the N-type thermoelectric elements (32N). Temperature rise of a light-emitting element (heat-dissipating element) such as an LED or a semiconductor laser mounted on the printed wiring board can be suppressed. For example, heat is generated from a light emitting-element (heat-dissipating element) such as an LED or a semiconductor laser mounted on the first pads (73F). In a cross-sectional direction, the core substrate 30 is positioned substantially at a center of the printed wiring board. The cross-sectional direction is perpendicular to the fifth surface (F).

The P-type thermoelectric elements (32P) and the N-type thermoelectric elements (32N) are connected to the first conductor circuit (58FW) via the first via conductors (60F). Therefore, even when the P-type thermoelectric elements (32P) and the N-type thermoelectric elements (32N) are embedded in the core substrate, heat can be transmitted to outside via the first conductor circuit (58FW). Heat can be efficiently transmitted to the outside. For example, heat can be transmitted to an integrated circuit having a large size such as an ASIC, or to a motherboard. Temperature rise of a heat-dissipating element mounted on the printed wiring board can be suppressed.

The core material (20z) is formed of a resin such as an epoxy resin and a reinforcing material such as a glass cloth. The core material (20z) may further contain inorganic particles such as silica particles. The first resin insulating layer (50F), the second resin insulating layer (50S), the third resin insulating layer (150F), and the fourth resin insulating layer (150S) are each formed of a resin such as an epoxy resin and inorganic particles such as silica particles. The third resin insulating layer (outermost first resin insulating layer) (150F) and the fourth resin insulating layer (outermost second resin insulating layer) (150S) may each further contain a reinforcing material such as a glass cloth.

In the printed wiring board 10 of the first embodiment, heat from an electronic component mounted on the second pads (73S) can be transmitted to an integrated circuit having a large size via the first pads (73F) by applying an electric current to the P-type thermoelectric elements (32P) and the N-type thermoelectric elements (32N).

Figure 2B:
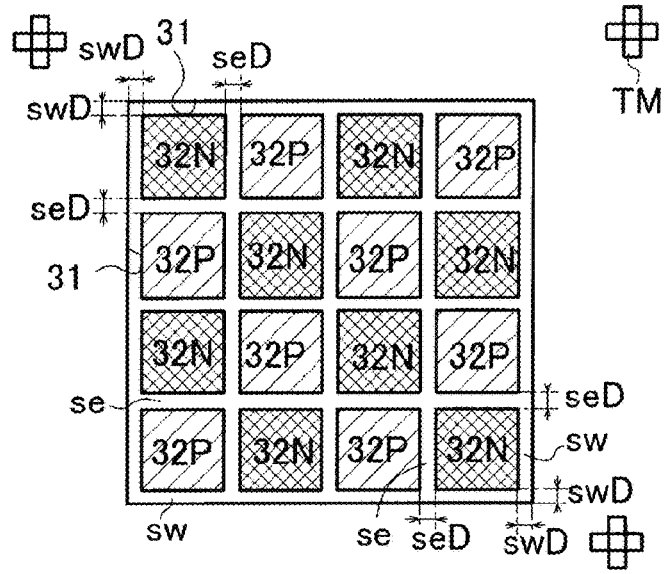

FIG. 2B illustrates positioning of the P-type thermoelectric elements (32P) and the N-type thermoelectric elements (32N) accommodated in the opening 31 of the core substrate 30. The P-type thermoelectric elements (32P) and the N-type thermoelectric elements (32N) are alternately positioned. Each of the N-type thermoelectric elements (32N) is positioned adjacent to one of the P-type thermoelectric elements (32P). As illustrated in FIG. 2B, on the drawing, an electronic component positioned above a P-type thermoelectric element (32P) is an N-type thermoelectric element (32N), an electronic component positioned below a P-type thermoelectric element (32P) is an N-type thermoelectric element (32N), an electronic component positioned on a right side of a P-type thermoelectric element (32P) is an N-type thermoelectric element (32N), and an electronic component positioned on a left side of a P-type thermoelectric element (32P) is an N-type thermoelectric element (32N). An electronic component positioned above an N-type thermoelectric element (32N) is a P-type thermoelectric element (32P), an electronic component positioned below an N-type thermoelectric element (32N) is a P-type thermoelectric element (32P), an electronic component positioned on a right side of an N-type thermoelectric element (32N) is a P-type thermoelectric element (32P), and an electronic component positioned on a left side of an N-type thermoelectric element (32N) is a P-type thermoelectric element (32P).

The number of the P-type thermoelectric elements (32P) and the number of the N-type thermoelectric elements (32N) accommodated in the one opening 31 are equal to each other.

Multiple kinds of electronic components are embedded in the one opening 31. Examples of the electronic components are the P-type thermoelectric elements (32P) and the N-type thermoelectric elements (32N). Further, the number of the electronic components of each kind is 2 or more. The core substrate 30 is not present between adjacent electronic components. The core material (20z) is not present between adjacent electronic components. Therefore, a size of the opening 31 for accommodating the electronic components can be reduced. A size of the printed wiring board 10 can be reduced. The number of the P-type thermoelectric elements (32P) is 10 or more, and the number of the N-type thermoelectric elements (32N) is 10 or more.

For example, the P-type thermoelectric elements (32P) and the N-type thermoelectric elements (32N) each have a cubical shape. An example of a length of each side is 1 mm.

As illustrated in FIG. 2B, spaces (se) exist between adjacent P-type thermoelectric elements (32P) and N-type thermoelectric elements (32N). The spaces (se) each have a width (seD) of 10 μm or more and 50 μm or less. Due to the existence of the spaces (se), interference between the P-type thermoelectric elements (32P) and the N-type thermoelectric elements (32N) can be suppressed.

As illustrated in FIG. 2B, spaces (sw) exist between the core substrate 30 and the P-type thermoelectric elements (32P). Spaces (sw) exist between the core substrate 30 and the N-type thermoelectric elements (32N). The spaces (sw) each have a width (swD) of 15 μm or more and 50 μm or less. Due to the existence of the spaces (sw), interference between the P-type thermoelectric elements (32P) and the fifth conductor layer (34F) can be suppressed. Interference between the N-type thermoelectric elements (32N) and the fifth conductor layer (34F) can be suppressed. Interference between the P-type thermoelectric elements (32P) and the sixth conductor layer (34S) can be suppressed. Interference between the N-type thermoelectric elements (32N) and the sixth conductor layer (34S) can be suppressed.

According to the printed wiring board 10 of the first embodiment, the multiple electronic components (the P-type thermoelectric elements (32P) and the N-type thermoelectric elements (32N)) 32 are accommodated in the one opening 31. Even when a large number of electronic components are embedded in the printed wiring board 10, the size of the printed wiring board 10 can be reduced. Even when the multiple electronic components are embedded in the printed wiring board, the printed wiring board 10 having a small size and a high cooling effect can be provided.

The spaces (se) and the spaces (sw) are filled with the resin 53 originating from the first resin insulating layer (50F). Therefore, the resin 53 formed in the opening 31 and the first resin insulating layer (50F) are integrally formed. An interface between the resin 53 and the first resin insulating layer (50F) is not formed. Therefore, even when the electronic components 32 in the opening 31 are subjected to repeated thermal expansion and thermal contraction, peeling does not occur between the resin 53 and the first resin insulating layer (50F). A highly reliable printed wiring board 10 can be provided. Since the sizes (seD, swD) of the spaces (se) and the spaces (sw) are in appropriate ranges, the resin 53 originating from the first resin insulating layer (50F) can enter into the spaces (se, sw). The spaces (se, sw) can be filled with the resin 53 originating from the first resin insulating layer (50F).

The first wirings (58FW) connect to each other only electronic components of different kinds. The second wirings (58sW) connect to each other only electronic components of different kinds. Interference between electronic components of the same kind can be suppressed. For example, each of the electronic components can exert its maximum capacity. A heat dissipation effect can be increased.

Manufacturing Method of First Embodiment

FIGS. 3A-5B illustrate a method for manufacturing the printed wiring board of the first embodiment.

Figure 3A:
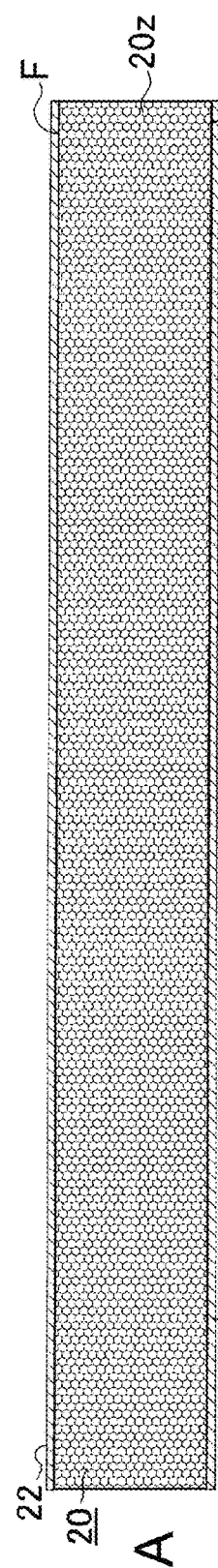
FIGS. 3A-3D are manufacturing process diagrams of the printed wiring board of the first embodiment.

A double-sided copper-clad laminated plate 20 is prepared (FIG. 3A). The double-sided copper-clad laminated plate 20 is formed of the core material (20z) having the fifth surface (F) and the sixth surface (S) on an opposite side with respect to the fifth surface (F) and a copper foil 22 laminated on both sides of the core material (20z).

Figure 3B:

Through holes for through-hole conductors are formed in the double-sided copper-clad laminated plate 20. The through-hole conductors 36 are formed in the through holes for through-hole conductors. After that, using a subtractive method, the fifth conductor layer (34F) is formed on the fifth surface (F) of the core material (20z). The sixth conductor layer (34S) is formed on the sixth surface (S) of the core material (20z). The fifth conductor layer (34F) and the sixth conductor layer (34S) are connected to each other by the through-hole conductors 36. A circuit substrate is completed. The fifth conductor layer (34F) has an alignment mark (TM). Using the alignment mark (TM) as a reference, the opening 31 penetrating the circuit substrate is formed at a center part of the circuit substrate. The core substrate 30 having the fifth surface (F) and the sixth surface (S) on an opposite side with respect to the fifth surface (F) is completed (FIG. 3B). The core substrate 30 has the fifth conductor layer (34F), the sixth conductor layer (34S), the through-hole conductors 36, and the opening 31. The fifth surface (F) of the core substrate 30 and the fifth surface (F) of the core material (20z) are the same surface, and the sixth surface (S) of the core substrate 30 and the sixth surface (S) of the core material (20z) are the same surface.

Figure 2C:
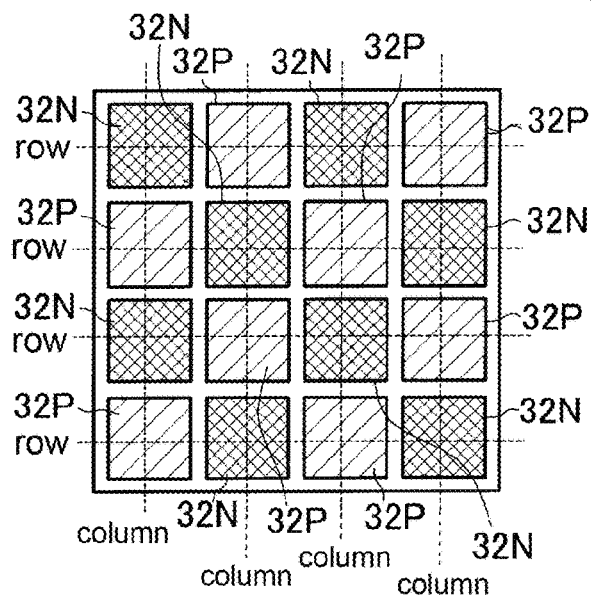
FIG. 2C illustrates positioning of the electronic components.
Figure 3C:
Figure 3D:
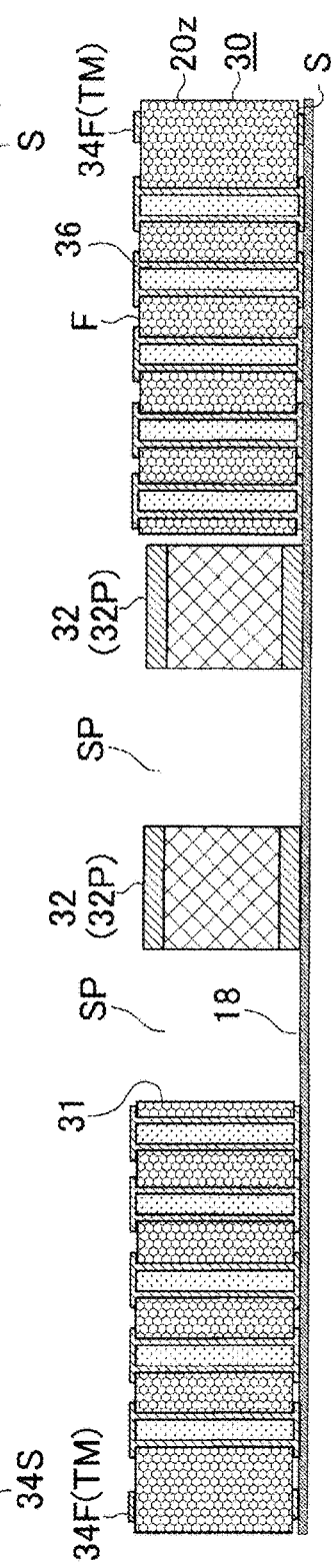

A tape 18 is pasted on the sixth surface (S) of the core substrate 30, and the opening 31 is closed (FIG. 3C). Using the alignment mark (TM) as a reference, first, the P-type thermoelectric elements (32P) are mounted one by one on the tape exposed from the opening 31. In this case, as illustrated in FIG. 2A, the P-type thermoelectric elements (32P) are mounted on the tape 18 such that the P-type thermoelectric elements (32P) are respectively adjacent to spaces (SP) for mounting the N-type thermoelectric elements (32N) (FIG. 3D). The P-type thermoelectric elements (32P) are positioned in rows and columns, and the P-type thermoelectric elements (32P) and the spaces (SP) are alternately positioned. The mounting of the P-type thermoelectric elements (32P) is completed. All the P-type thermoelectric elements (32P) accommodated in the one opening 31 are amounted on the tape 18. After that, using the alignment mark (TM) as a reference, the N-type thermoelectric elements are mounted one by one on the tape exposed from the opening 31 and the P-type thermoelectric elements (32P). In this case, as illustrated in FIG. 2B, the N-type thermoelectric elements (32N) are placed in the spaces (SP). The P-type thermoelectric elements (32P) and the N-type thermoelectric elements (32N) are adjacent to each other. The N-type thermoelectric elements (32N) are positioned in rows and columns, and the P-type thermoelectric elements (32P) and the N-type thermoelectric elements (32N) are alternately positioned (FIG. 4A). As illustrated in FIG. 2C, the P-type thermoelectric elements (32P) and the N-type thermoelectric elements (32N) are positioned at intersection points of the rows and the columns. The number of the rows and the number of the columns are the same. The number of the rows is 4 or more, and the number of the columns is 4 or more. In the method for manufacturing the printed wiring board of the first embodiment, first, all the P-type thermoelectric elements (32P) are accommodated in the opening 31. After that, all the N-type thermoelectric elements (32N) are accommodated in the opening 31. Therefore, the two kinds of electronic components (32P, 32N) can be accommodated at correct positions. The formation of the opening 31 and the mounting of the electronic components (32P, 32N) are performed using the same alignment mark (TM) as a reference. Therefore, positional accuracy between the opening 31 and the electronic components (32P, 32N) can be increased. Positional accuracy between the P-type thermoelectric elements (32P) and the N-type thermoelectric elements (32N) can be increased. The width (seD) of each of the spaces (se) can be kept in a predetermined range (10 μm or more and 50 μm or less). The width (swD) of each of the spaces (sw) can be kept in a predetermined range (15 μm or more and 50 μm or less).

The P-type thermoelectric elements (32P) and the N-type thermoelectric elements (32N) can be mounted in any order.

When the electronic components (32P, 32N) are mounted on the tape 18, an uncured film for resin insulating layer formation is laminated on the fifth surface (F) of the core substrate 30. In this case, the film for resin insulating layer formation covers the opening 31. After that, by hot pressing, the film for resin insulating layer formation is softened. The spaces (se) and the spaces (sw) are filled with a resin containing inorganic particles originating from a film for forming a resin insulating layer (FIG. 4B). The film for forming the resin insulating layer, the resin filling the spaces (se) and the resin filling the spaces (sw) are cured. The first resin insulating layer (50F) is formed on the core substrate 30 and the opening 31. The resin 53 filled in the spaces (se) and the spaces (sw) is formed. The first resin insulating layer (50F) and the resin 53 are integrally formed.

The first resin insulating layer (50F) has a bottom surface (BF) opposing the fifth surface (F) and a top surface (TF) on an opposite side with respect to the bottom surface (BF).

The tape 18 is removed from the core substrate 30. The second resin insulating layer (50S) is formed on the sixth surface (S) of the core substrate 30 and the opening 31 (FIG. 4C).

The second resin insulating layer (50S) has a bottom surface (BS) opposing the sixth surface (S) and a top surface (TS) on an opposite side with respect to the bottom surface (BS).

The first conductor layer (58F) is formed on the first resin insulating layer (50F). At the same time, the first via conductors (60F) penetrating the first resin insulating layer (50F) are formed. The first conductor layer (58F) and the first via conductors (60F) are formed using a semi-additive method. Openings for the first via conductors penetrating the first resin insulating layer (50F) are formed. Then, by filling the openings, the first via conductors (60F) are formed. The openings for the first via conductors each have the top diameter (TDF) at the position of the top surface (TF) of the first resin insulating layer (50F).

The first conductor layer (58F) includes the on-first-electrode first conductor circuits (58FW1) each of which is formed on one P-type thermoelectric element (32P), and the on-third-electrode first conductor circuits (58FW3) each of which is formed on one N-type thermoelectric element (32N). The multiple on-first-electrode first conductor circuits (58FW1) and the multiple on-third-electrode first conductor circuits (58FW3) are formed. A first electronic component (32P) and a second electronic component (32N), which are adjacent to each other, are connected to each other by one first wiring (58FW). One first electronic component (32P) and one second electronic component (32N) are connected to each other by one first wiring (58FW).

The first via conductors (60F) include the for-fifth-conductor-layer first via conductors (60F5) that connect the first conductor layer (58F) to the fifth conductor layer (34F), the for-first-electrode first via conductors (60F1) that connect the first electrodes (32P1) to the first conductor circuit (58FW), and the for-third-electrode first via conductors (60F3) that connect the third electrodes (32P3) to the first conductor circuit (58FW). The for-fifth-conductor-layer first via conductors (60F5) each have the top diameter (TDF) at the position of the top surface (TF). The for-first-electrode first via conductors (60F1) each have the top diameter (TDF) at the position of the top surface (TF). The for-third-electrode first via conductors (60F3) each have the top diameter (TDF) at the position of the top surface (TF). The top diameter (TDF) of each of the for-fifth-conductor-layer first via conductors (60F5), the top diameter (TDF) of each of the for-first-electrode first via conductors (60F1), and the top diameter (TDF) of each of the for-third-electrode first via conductors (60F3) are substantially equal to each other. The for-first-electrode first via conductors (60F1) and the for-third-electrode first via conductors (60F3) are formed using the alignment mark (TM) as a reference.

One first electrode (32P1) is connected to the first conductor circuit (58FW) by multiple for-first-electrode first via conductors (60F1). For example, the number of the for-first-electrode first via conductors (60F1) connecting one first electrode (32P1) to the first conductor circuit (58FW) is 30 or more and 40 or less.

One third electrode (32P3) is connected to the first conductor circuit (58FW) by multiple for-third-electrode first via conductors (60F3). For example, the number of the for-third-electrode first via conductors (60F3) connecting one third electrode (32P3)) to the first conductor circuit (58FW) is 30 or more and 40 or less.

The second conductor layer (58S) is formed on the second resin insulating layer (50S). At the same time, the second via conductors (60S) penetrating the second resin insulating layer (50S) are formed. The second conductor layer (58S) and the second via conductors (60S) are formed using a semi-additive method. Openings for the second via conductors penetrating the second resin insulating layer (50S) are formed. Then, by filling the openings, the second via conductors (60S) are formed. The openings for the second via conductors each have the top diameter (TDS) at the position of the top surface (TS) of the second resin insulating layer (50S).

The second conductor layer (58S) includes the on-second-electrode second conductor circuits (58SW2) each of which is formed on one first electronic component (32P), and the on-fourth-electrode second conductor circuits (58SW4) each of which is formed on one second electronic component (32N). The multiple on-second-electrode second conductor circuits (58SW2) and the multiple on-fourth-electrode second conductor circuits (58SW4) are formed. A first electronic component (32P) and a second electronic component (32N), which are adjacent to each other, are connected to each other by one second wiring (58sW). One first electronic component (32P) and one second electronic component (32N) are connected to each other by one second wiring (58sW).

The second via conductors (60S) include the for-sixth-conductor-layer second via conductors (60S6) that connect the second conductor layer (58S) to the sixth conductor layer (34S), the for-second-electrode second via conductors (60S2) that connect the second electrodes (32P2) to the second conductor circuit (58SW), and the for-fourth-electrode second via conductors (60S4) that connect the fourth electrodes (32P4) to the second conductor circuit (58SW). The for-sixth-conductor-layer second via conductors (60S6) each have the top diameter (TDS) at the position of the top surface (TS). The for-second-electrode second via conductors (60S2) each have the top diameter (TDS) at the position of the top surface (TS). The for-fourth-electrode second via conductors (60S4) each have the top diameter (TDS) at the position of the top surface (TS). The top diameter (TDS) of each of the for-sixth-conductor-layer second via conductors (60S6), the top diameter (TDS) of each of the for-second-electrode second via conductors (60S2) and the top diameter (TDS) of each of the for-fourth-electrode second via conductors (60S4) are substantially equal to each other.

One second electrode (32P2) is connected to the second conductor circuit (58SW) by multiple for-second-electrode second via conductors (60S2). For example, the number of the for-second-electrode second via conductors (60S2) connecting one second electrode (32P2) to the second conductor circuit (58SW) is 30 or more and 40 or less.

One fourth electrode (32P4) is connected to the second conductor circuit (58SW) by multiple for-fourth-electrode second via conductors (60S4). For example, the number of the for-fourth-electrode second via conductors (60S4) connecting one fourth electrode (32P4) to the second conductor circuit (58SW) is 30 or more and 40 or less (FIG. 5A).

The third resin insulating layer (150F) is formed on the first conductor layer (58F) and the first resin insulating layer (50F). The third conductor layer (158F) is formed on the third resin insulating layer (150F) using a semi-additive method. At the same time, the third via conductors (160F) penetrating the third resin insulating layer (150F) and connecting the first conductor layer (58F) and the third conductor layer (158F) to each other are formed (FIG. 5B). For example, there is no third via conductor (160F) that connects the third conductor layer (158F) and the first conductor circuit (58FW) to each other.

The fourth resin insulating layer (150S) is formed on the second conductor layer (58S) and the second resin insulating layer (50S). The fourth conductor layer (158S) is formed on the fourth resin insulating layer (150S) using a semi-additive method. At the same time, the fourth via conductors (160S) penetrating the fourth resin insulating layer (150S) and connecting the second conductor layer (58S) and the fourth conductor layer (158S) to each other are formed (FIG. 5B). For example, there is no fourth via conductors (160S) that connects the fourth conductor layer (158S) and the second conductor circuit (58SW) to each other.

The first solder resist layer (70F) having the first openings (71F) are formed on the third conductor layer (158F) and the third resin insulating layer (150F). The second solder resist layer (70S) having second openings (71S) are formed on the fourth conductor layer (158S) and the fourth resin insulating layer (150S). The printed wiring board 10 is completed (FIG. 1A). The third conductor layer (158F) exposed from the first openings (71F) functions as the pads for mounting an electronic component. The fourth conductor layer (158S) exposed from the second openings (71S) functions as the pads for connecting to a light-emitting element such as an LED or a semiconductor laser.

According to an embodiment, temperature of an electronic component mounted on the printed wiring board can be controlled within a predetermined range.

In Japanese Patent Application Laid-Open Publication No. 2012-39050, through holes are formed in the metal substrate. And, in Japanese Patent Application Laid-Open Publication No. 2012-39050, one semiconductor element is accommodated in each of the through holes. Therefore, according to Japanese Patent Application Laid-Open Publication No. 2012-39050, it is expected that, when the number of the semiconductor elements embedded in the metal substrate increases, the substrate becomes large.

A printed wiring board according to an embodiment of the present invention includes: a core substrate having a core material that has a fifth surface and a sixth surface on an opposite side with respect to the fifth surface, and an opening that penetrates the core material and is for accommodating multiple P-type thermoelectric elements and multiple N-type thermoelectric elements; the multiple P-type thermoelectric elements accommodated in the opening; the multiple N-type thermoelectric elements accommodated in the opening; a first build-up layer that includes a first resin insulating layer formed on the fifth surface and on the opening and is on a side where a heat-absorbing element is mounted; and a second build-up layer that includes a second resin insulating layer formed on the sixth surface and on the opening and is on a side where a heat-generating element is mounted. A thickness of the second resin insulating layer is a larger than a thickness of the first resin insulating layer.

According to an embodiment of the present invention, the multiple P-type thermoelectric elements and the multiple N-type thermoelectric elements are accommodated in the one opening formed in the core substrate. Therefore, the opening can be reduced in size, and the printed wiring board can be reduced in size. By reducing the thickness of the first resin insulating layer on the first build-up layer side where a heat-absorbing element having a size larger than that of a heat-generating element is mounted and where a larger stress is applied, a length of each of the via conductors provided in the first resin insulating layer is shortened, resistance against a large stress is increased, and reliability of the via conductors is increased.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a core substrate comprising a core material and having an opening such that the opening penetrates through the core substrate;
a plurality of thermoelectric elements comprising a plurality of P-type thermoelectric elements and a plurality of N-type thermoelectric elements such that the plurality of thermoelectric elements is accommodated in the opening of the core substrate;
a first build-up layer configured to mount a heat-absorbing element thereon and comprising a first resin insulating layer such that the first resin insulating layer is formed on a first surface of the core substrate and covering the opening of the core substrate; and
a second build-up layer configured to mount a heat-generating element thereon and comprising a second resin insulating layer such that the second resin insulating layer is formed on a second surface of the core substrate on an opposite side with respect to the first surface of the core substrate and covering the opening of the core substrate and has a thickness that is greater than a thickness of the first resin insulating layer,
wherein the first build-up layer includes a first conductor layer formed on the first resin insulating layer, and a plurality of first via conductors penetrating through the first resin insulating layer and connecting the first conductor layer to the plurality of P-type thermoelectric elements and the plurality of N-type thermoelectric elements, the second build-up layer includes a second conductor layer formed on the second resin insulating layer, and a plurality of second via conductors penetrating through the second resin insulating layer and connecting the second conductor layer to the plurality of P-type thermoelectric elements and the plurality of N-type thermoelectric elements such that each of the second via conductors has a length that is greater than a length of each of the first via conductors, and each of the first and second via conductors has a recess portion formed on an upper surface thereof such that the recess portion in each of the second via conductors has a depth that is greater than a depth of the recess portion in each of the first via conductors.

2. The printed wiring board according to claim 1, wherein the first build-up layer includes an outermost third resin insulating layer formed on the first resin insulating layer and is formed such that the first resin insulating layer comprises a resin material and does not contain a core material and that the outermost third resin insulating layer comprises a resin material and a core material, and the second build-up layer includes an outermost fourth resin insulating layer formed on the second resin insulating layer and is formed such that the second resin insulating layer comprises a resin material and does not contain a core material and that the outermost fourth resin insulating layer comprises a resin material and a core material.

3. The printed wiring board according to claim 2, wherein the first build-up layer is formed such that no via conductors penetrating through the outermost third resin insulating layer are formed on the plurality of first via conductors directly connected to the plurality of P-type thermoelectric elements and the plurality of N-type thermoelectric elements, and the second build-up layer is formed such that no via conductors penetrating through the outermost fourth resin insulating layer are formed on the plurality of second via conductors directly connected to the plurality of P-type thermoelectric elements and the plurality of N-type thermoelectric elements.

4. The printed wiring board according to claim 1, wherein the plurality of thermoelectric elements is positioned in rows and columns in the opening of the core substrate such that the P-type thermoelectric elements and the N-type thermoelectric elements are alternately positioned at intersection points of the rows and the columns.

5. The printed wiring board according to claim 4, wherein the rows and the columns are same numbers.

6. The printed wiring board according to claim 4, wherein the first build-up layer includes an outermost third resin insulating layer formed on the first resin insulating layer and is formed such that the first resin insulating layer comprises a resin material and does not contain a core material and that the outermost third resin insulating layer comprises a resin material and a core material, and the second build-up layer includes an outermost fourth resin insulating layer formed on the second resin insulating layer and is formed such that the second resin insulating layer comprises a resin material and does not contain a core material and that the outermost fourth resin insulating layer comprises a resin material and a core material.

7. The printed wiring board according to claim 6, wherein the first build-up layer is formed such that no via conductors penetrating through the outermost third resin insulating layer are formed on the plurality of first via conductors directly connected to the plurality of P-type thermoelectric elements and the plurality of N-type thermoelectric elements, and the second build-up layer is formed such that no via conductors penetrating through the outermost fourth resin insulating layer are formed on the plurality of second via conductors directly connected to the plurality of P-type thermoelectric elements and the plurality of N-type thermoelectric elements.

8. The printed wiring board according to claim 6, wherein the rows and the columns are same numbers.

9. The printed wiring board according to claim 7, wherein the rows and the columns are same numbers.

10. A printed wiring board, comprising:
a core substrate comprising a core material and having an opening such that the opening penetrates through the core substrate;
a plurality of thermoelectric elements comprising a plurality of P-type thermoelectric elements and a plurality of N-type thermoelectric elements such that the plurality of thermoelectric elements is accommodated in the opening of the core substrate;
a first build-up layer configured to mount a heat-absorbing element thereon and comprising a first resin insulating layer such that the first resin insulating layer is formed on a first surface of the core substrate and covering the opening of the core substrate; and
a second build-up layer configured to mount a heat-generating element thereon and comprising a second resin insulating layer such that the second resin insulating layer is formed on a second surface of the core substrate on an opposite side with respect to the first surface of the core substrate and covering the opening of the core substrate and has a thickness that is greater than a thickness of the first resin insulating layer,
wherein the first build-up layer includes a first conductor layer formed on the first resin insulating layer, and a plurality of first via conductors penetrating through the first resin insulating layer and connecting the first conductor layer to the plurality of P-type thermoelectric elements and the plurality of N-type thermoelectric elements, and the second build-up layer includes a second conductor layer formed on the second resin insulating layer, and a plurality of second via conductors penetrating through the second resin insulating layer and connecting the second conductor layer to the plurality of P-type thermoelectric elements and the plurality of N-type thermoelectric elements such that each of the second via conductors has a length that is greater than a length of each of the first via conductors.

11. The printed wiring board according to claim 10, wherein the first build-up layer includes an outermost third resin insulating layer formed on the first resin insulating layer and is formed such that the first resin insulating layer comprises a resin material and does not contain a core material and that the outermost third resin insulating layer comprises a resin material and a core material, and the second build-up layer includes an outermost fourth resin insulating layer formed on the second resin insulating layer and is formed such that the second resin insulating layer comprises a resin material and does not contain a core material and that the outermost fourth resin insulating layer comprises a resin material and a core material.

12. The printed wiring board according to claim 11, wherein the first build-up layer is formed such that no via conductors penetrating through the outermost third resin insulating layer are formed on the plurality of first via conductors directly connected to the plurality of P-type thermoelectric elements and the plurality of N-type thermoelectric elements, and the second build-up layer is formed such that no via conductors penetrating through the outermost fourth resin insulating layer are formed on the plurality of second via conductors directly connected to the plurality of P-type thermoelectric elements and the plurality of N-type thermoelectric elements.

13. The printed wiring board according to claim 11, wherein the plurality of thermoelectric elements is positioned in rows and columns in the opening of the core substrate such that the P-type thermoelectric elements and the N-type thermoelectric elements are alternately positioned at intersection points of the rows and the columns.

14. The printed wiring board according to claim 10, wherein the plurality of thermoelectric elements is positioned in rows and columns in the opening of the core substrate such that the P-type thermoelectric elements and the N-type thermoelectric elements are alternately positioned at intersection points of the rows and the columns.

15. The printed wiring board according to claim 14, wherein the rows and the columns are same numbers.

16. A printed wiring board, comprising:
a core substrate comprising a core material and having an opening such that the opening penetrates through the core substrate;
a plurality of thermoelectric elements comprising a plurality of P-type thermoelectric elements and a plurality of N-type thermoelectric elements such that the plurality of thermoelectric elements is accommodated in the opening of the core substrate;
a first build-up layer configured to mount a heat-absorbing element thereon and comprising a first resin insulating layer such that the first resin insulating layer is formed on a first surface of the core substrate and covering the opening of the core substrate; and
a second build-up layer configured to mount a heat-generating element thereon and comprising a second resin insulating layer such that the second resin insulating layer is formed on a second surface of the core substrate on an opposite side with respect to the first surface of the core substrate and covering the opening of the core substrate and has a thickness that is greater than a thickness of the first resin insulating layer,
wherein the first build-up layer includes a first conductor layer formed on the first resin insulating layer, and a plurality of first via conductors penetrating through the first resin insulating layer and connecting the first conductor layer to the plurality of P-type thermoelectric elements and the plurality of N-type thermoelectric elements, the second build-up layer includes a second conductor layer formed on the second resin insulating layer, and a plurality of second via conductors penetrating through the second resin insulating layer and connecting the second conductor layer to the plurality of P-type thermoelectric elements and the plurality of N-type thermoelectric elements, and each of the first and second via conductors has a recess portion formed on an upper surface thereof such that the recess portion in each of the second via conductors has a depth that is greater than a depth of the recess portion in each of the first via conductors.

17. The printed wiring board according to claim 16, wherein the first build-up layer includes an outermost third resin insulating layer formed on the first resin insulating layer and is formed such that the first resin insulating layer comprises a resin material and does not contain a core material and that the outermost third resin insulating layer comprises a resin material and a core material, and the second build-up layer includes an outermost fourth resin insulating layer formed on the second resin insulating layer and is formed such that the second resin insulating layer comprises a resin material and does not contain a core material and that the outermost fourth resin insulating layer comprises a resin material and a core material.

18. The printed wiring board according to claim 17, wherein the first build-up layer is formed such that no via conductors penetrating through the outermost third resin insulating layer are formed on the plurality of first via conductors directly connected to the plurality of P-type thermoelectric elements and the plurality of N-type thermoelectric elements, and the second build-up layer is formed such that no via conductors penetrating through the outermost fourth resin insulating layer are formed on the plurality of second via conductors directly connected to the plurality of P-type thermoelectric elements and the plurality of N-type thermoelectric elements.

19. The printed wiring board according to claim 16, wherein the plurality of thermoelectric elements is positioned in rows and columns in the opening of the core substrate such that the P-type thermoelectric elements and the N-type thermoelectric elements are alternately positioned at intersection points of the rows and the columns.

20. The printed wiring board according to claim 19, wherein the rows and the columns are same numbers.

* * * * *